United States Patent [19]
Gross

[11] Patent Number: 5,739,997
[45] Date of Patent: *Apr. 14, 1998

[54] SUPERCONDUCTING-MAGNET ELECTRICAL CIRCUIT OFFERING QUENCH PROTECTION

[75] Inventor: Dan Arthur Gross, Niskayuna, N.Y.

[73] Assignee: General Electric Company, Schenectady, N.Y.

[*] Notice: The term of this patent shall not extend beyond the expiration date of Pat. No. 5,650,903.

[21] Appl. No.: 565,139

[22] Filed: Nov. 30, 1995

[51] Int. Cl.$^6$ .................................................. H02H 7/00
[52] U.S. Cl. ............................................. 361/19; 335/216
[58] Field of Search ..................... 361/10, 11, 19, 361/58, 141; 336/DIG. 1; 335/216, 296, 299; 174/125.1; 505/825, 850, 879

[56] References Cited

U.S. PATENT DOCUMENTS

| | | | |
|---|---|---|---|
| 4,764,837 | 8/1988 | Jones | 361/19 |
| 4,956,740 | 9/1990 | Williams | 361/19 |
| 5,333,087 | 7/1994 | Takechi et al. | 361/19 |

OTHER PUBLICATIONS

Concurrently filed U.S. Patent Application RD–24753, by Dan A. Gross et al., entitled "Superconducting–Magnet Electrical Circuit Having Voltage and Quench Protection", U.S. Application Ser. No. 08/565,140.

*Primary Examiner*—Ronald W. Leja
*Attorney, Agent, or Firm*—Douglas E. Erickson; Marvin Snyder

[57] ABSTRACT

A superconductive-magnet electrical circuit includes a superconductive-coil assemblage having a second coil portion coupled in series with and between first and third coil portions with the third coil portion coupled in series with and between the second and a fourth coil portion. A bipolar current-bypass electrical-circuit element (such as a pair of diodes opposingly coupled together in parallel) has: an impedance less than generally one-thousandth that of the coil portions; a first terminal coupled in parallel with the first and second coil portions; and a second terminal coupled in parallel with the third and fourth coil portions. A localized quench in one coil portion will be quickly shared with the other coil portions to reduce damage from the quench.

9 Claims, 3 Drawing Sheets

SUPERCONDUCTING-MAGNET ELECTRICAL CIRCUIT OFFERING QUENCH PROTECTION

BACKGROUND OF THE INVENTION

The present invention relates generally to superconductive magnets and more particularly to a superconducting-magnet electrical circuit which protects its superconductive-coil assemblage from damage during a quench.

Superconducting magnets are those superconducting devices which have a superconductive-coil assemblage and include, but are not limited to, magnetic resonance imaging (MRI) systems for medical diagnosis, superconductive rotors for electric generators and motors, and magnetic levitation devices for train transportation. Magnets wound of superconductive material offer the advantage that they can carry significant electrical currents without suffering any power loss due to the fact that superconductive windings offer no resistance to electrical current flow. As a consequence of this zero resistance property, wire or tape that is quite small is capable of carrying very large currents in the superconducting state. This property has been especially beneficial in the construction of MRI magnets because they require very high static magnetic fields.

When designing superconducting magnets, however, one must consider the possibility that the superconducting wire or tape may "lose" its superconducting capabilities at some point and become resistive. This transformation from a superconducting state to a resistive state is known as "quenching" and may be caused, for example, by loss of the cryogenic cooling needed for superconductivity to occur. In the event that the superconductive wire becomes resistive, the wire that normally carries the large electrical currents with no resistive heating now generates both high voltages and high power losses. These voltages and power losses can be quite damaging to the magnet if they are allowed to become too large or remain too localized.

As a consequence of the above, magnets are designed such that the "quench" is propagated as quickly as possible after initiation; that is, if some area of the winding quenches, the magnet is designed so that the entire winding becomes resistive as soon as possible. This design criteria results in lower voltages and lower peak temperatures since the stored energy of the magnet is dispersed throughout a larger mass. Known quench protection techniques include using a quench-detection signal (from the electrical center of the superconductive coil assemblage of the superconductive device) directly supplying an energy dump resistor or directly powering a wide-area electrical heater located near the superconductive coil assemblage of the superconductive device. Such known techniques take a relatively long time to work. It is also known to amplify the quench-detection signal outside the cryostat, but this raises issues of reliability and additional cryostat penetrations.

SUMMARY OF THE INVENTION

It is an object of the invention to provide a superconducting-magnet electrical circuit offering quench protection for its superconductive-coil assemblage.

The superconductive-magnet electrical circuit of the invention contains a superconductive-coil assemblage including first, second, third, and fourth superconductive-coil portions together having a total electrical impedance. The second superconductive-coil portion is coupled in series with and between the first and third superconductive-coil portions, and the third superconductive-coil portion is coupled in series with and between the second and fourth superconductive portions. The electrical circuit also contains a bipolar current-bypass electrical-circuit element (such as first and second diodes opposingly coupled together in parallel) having a first terminal, a second terminal, and an electrical impedance less than generally one-thousandth of the total electrical impedance of the four superconductive-coil portions of the superconductive-coil assemblage. The bipolar current-bypass electrical-circuit element is coupled to the superconductive-coil assemblage only through the first and second terminals. The first terminal is only coupled to the superconductive-coil assemblage in parallel with the first and second superconductive-coil portions, and the second terminal is only coupled to the superconductive-coil assemblage in parallel with the third and fourth superconductive-coil portions.

Several benefits and advantages are derived from the invention. At cryogenic-cooling temperatures, diodes only pass electric current in the forward direction for voltages associated with a quench event. Thus, for example, the preferred first and second diodes of the superconductive-magnet electrical circuit of the invention together function to ensure that a localized quench in the first or second superconductive-coil portions of the circuit will be quickly shared with the third and fourth superconductive-coil portions of the circuit which lessens the damaging impact on the first or second superconductive-coil portions. It is noted that the results are the same for a quench starting in the third or fourth superconductive-coil portions.

BRIEF DESCRIPTION OF THE DRAWINGS

The accompanying drawings illustrate a preferred embodiment of the present invention wherein.

DETAILED DESCRIPTION OF THE INVENTION

Figure 1:
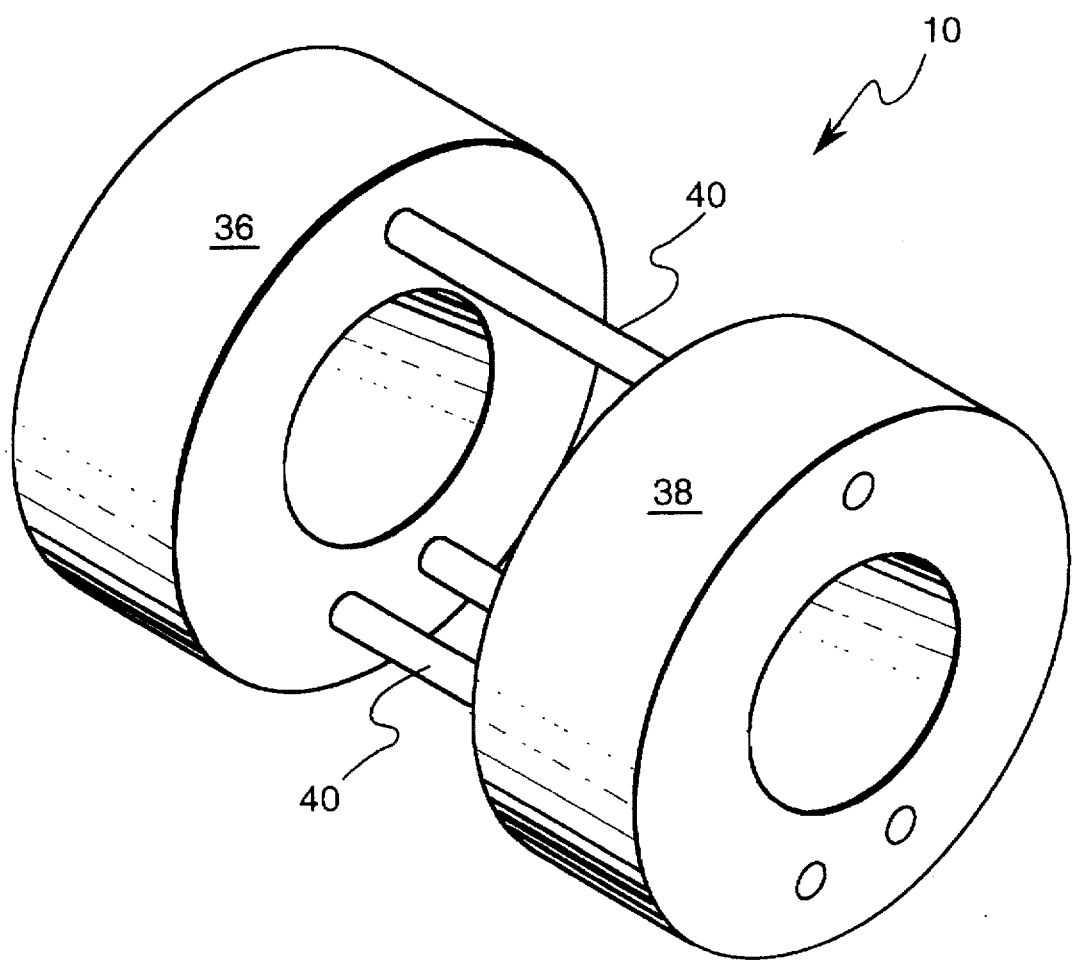
FIG. 1 is a perspective view of an open MRI magnet (with the magnet floor mount omitted for clarity) which includes the superconductive-magnet electrical circuit of the invention.
Figure 2:
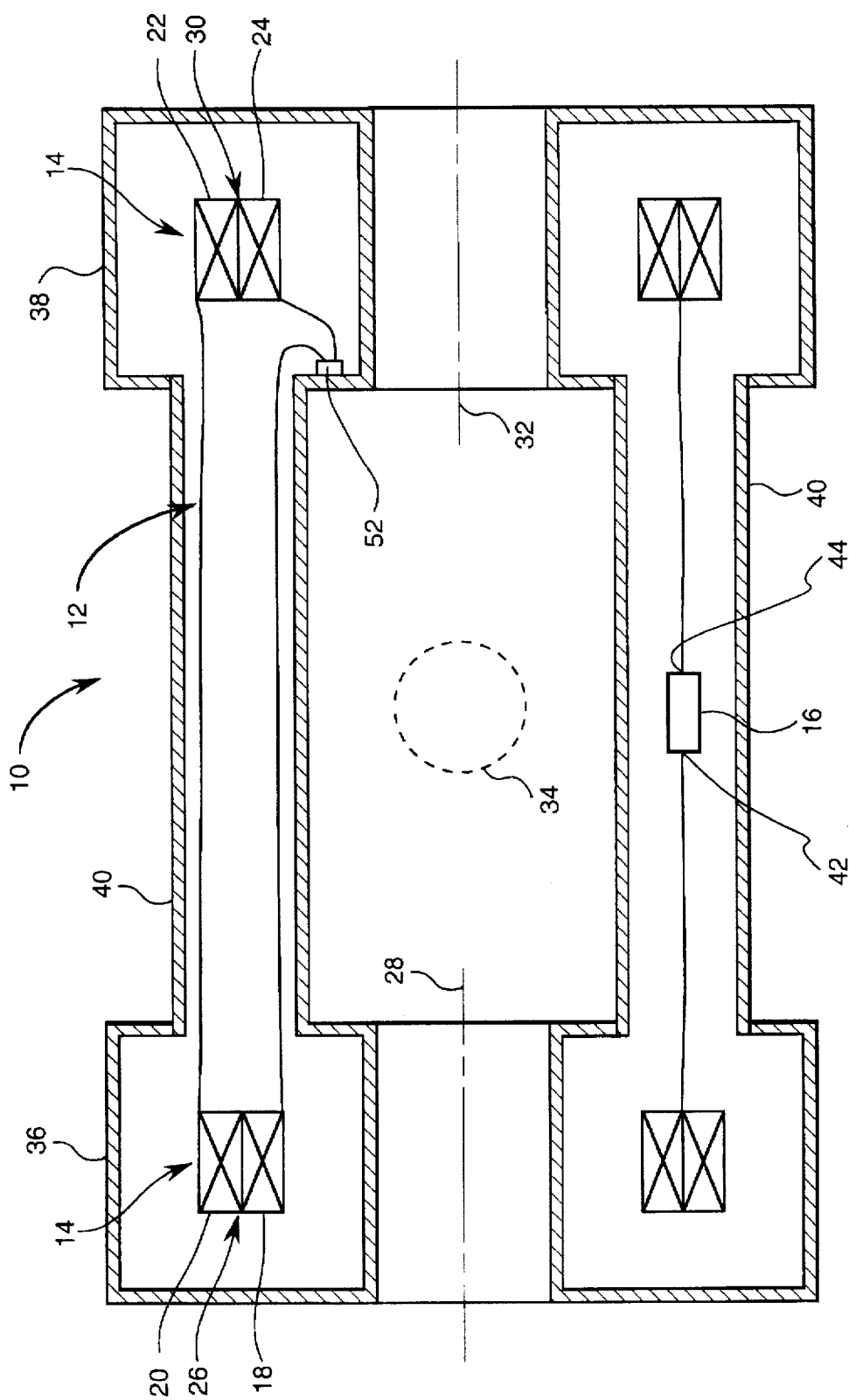
FIG. 2 is a schematic cross-sectional side-elevational view of the open MRI magnet of FIG. 1 showing a preferred physical embodiment of the superconductive-magnet electrical circuit of the invention.
Figure 3:
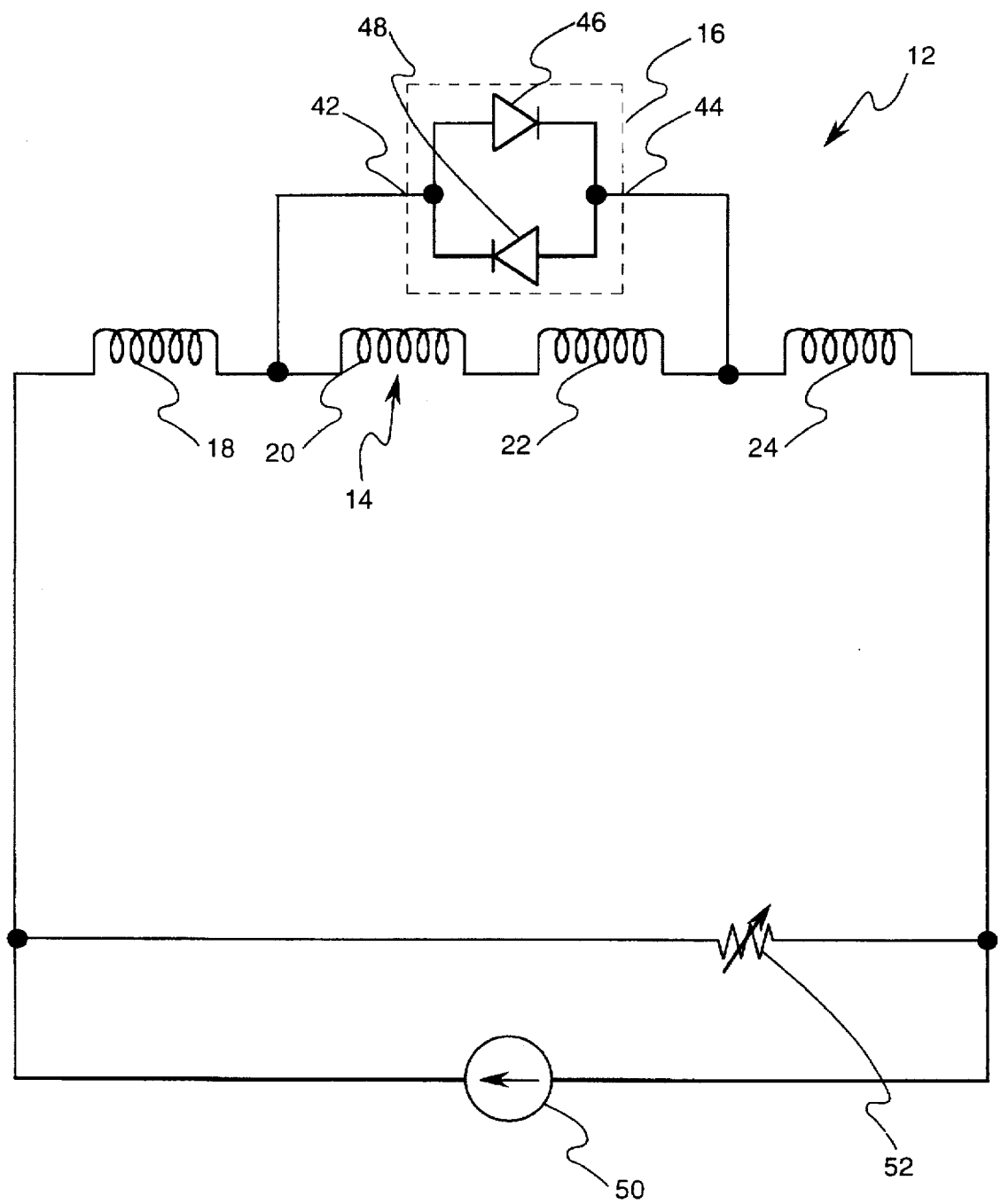
FIG. 3 is a more-detailed schematic circuit diagram of the electric circuit physically shown in FIG. 2.

Referring now to the drawings, FIG. 1 shows a preferred superconducting magnet 10 which utilizes the superconductive-magnet electrical circuit of the invention. A preferred physical embodiment of the superconductive-magnet electrical circuit 12 of the invention is shown in FIG. 2, and a preferred, more-detailed schematic circuit diagram of the circuit 12 is shown in FIG. 3. The circuit 12 contains a superconductive-coil assemblage 14 and a bipolar current-bypass electrical-circuit element 16.

The superconductive-coil assemblage 14 includes first, second, third, and fourth superconductive-coil portions 18, 20, 22, and 24 together having a total electrical impedance. For purposes of describing the invention, when the terminology "electrical impedance" is used in reference to any element (or group of elements) of the circuit 12, it refers to the conducting electrical impedance of that element (or group of elements) at the operating superconducting temperature (e.g., ten Kelvin) of the superconductive-coil assemblage 14. It is noted that some elements, such as diodes, have forward bias voltages which must be exceeded before they can conduct electric current, and they have very large "non-conducting" electrical impedances and very small "conducting" electrical impedances. The second superconductive-coil portion 20 is coupled in series with and between the first and third superconductive-coil portions 18 and 22, and the third superconductive-coil portion 22 is coupled in series with and between the second and fourth superconductive-coil portions 20 and 24. Preferably, the first and second superconductive-coil portions 18 and 20 together define a generally annular-shaped first superconductive coil 26 having a generally longitudinally-extending first axis 28, and the third and fourth superconductive-coil portions 22 and 24 together define a generally annular-shaped second superconductive coil 30 having a generally longitudinally-extending second axis 32. In an exemplary enablement, the second superconductive coil 30 is longitudinally spaced apart from the first superconductive coil 26, and the second axis 32 is generally coaxially aligned with the first axis 28. In a preferred embodiment, the superconductive-coil assemblage 14 is a magnetic resonance imaging (MRI) superconductive-coil assemblage 14 having an imaging volume 34 located generally longitudinally midway between the first and second superconductive coils 26 and 30. The imaging volume 34 typically is generally spherical in shape.

Preferably, the superconducting magnet 10 is an open type magnet (as shown in FIGS. 1 and 2), but the circuit 12 of the invention is equally applicable to other types of superconductive magnets including, but not limited to, closed magnets, as can be appreciated by the artisan. It is noted that the first superconductive coil 26 is generally surrounded by a generally toroidal-shaped first housing 36, that the second superconductive coil 30 is generally surrounded by a generally toroidal-shaped second housing 38, and that the two housings 36 and 38 preferably are longitudinally separated by a plurality of posts 40 each having a first end hermetically attached to the first housing 36 and having a second end hermetically attached to the second housing 38. The housings 36 and 38 and the posts 40 together define a single vacuum enclosure. It is noted that the superconductive coils 26 and 30 are supported on coil forms (omitted from the figures for clarity). Preferably, the superconductive-coil assemblage 14 is wound from a monolithic length of insulated, copper-stabilized Nb—Sn superconductive tape or wire and is cooled to below its critical temperature (i.e., the temperature needed for superconductivity to occur) by a cryogenic liquid (such as liquid helium) and/or by a cryocooler coldhead (e.g., a coldhead of a Gifford-McMahon cryocooler). Such cooling apparatus, as well as any required thermal shield(s), are well known in the art, do not form part of the circuit 12 of the invention, and are not shown in the figures. It is noted that magnet elements of different temperatures would be separated by thermally-insulative spacers.

In a first preferred construction (shown in FIG. 2), the second superconductive-coil portion 20 is disposed radially outward of, and is radially superimposed on, the first superconductive-coil portion 18, and the third superconductive-coil portion 22 is disposed radially outward of, and is radially superimposed on, the fourth superconductive-coil portion 24. In a second (but less) preferred construction (shown in FIG. 3), the first superconductive-coil portion 18 is disposed longitudinally adjacent to the second superconductive-coil portion 20, and the fourth superconductive-coil portion 24 is disposed longitudinally adjacent to the third superconductive-coil portion 22. Preferably, the first superconductive coil 26 is generally identical to the second superconductive coil 30, the first and fourth superconductive-coil portions 18 and 24 are generally identical, and the second and third superconductive-coil portions 20 and 22 are generally identical.

The bipolar current-bypass electrical-circuit element 16 of the circuit 12 of the invention has a first terminal 42, a second terminal 44, and an electrical impedance less than generally one-thousandth of the total electrical impedance of the four superconductive-coil portions 18 to 22 of the superconductive-coil assemblage 14. As an example, and without limitation, a typical superconducting magnet 10 may have a generally 0.5 Tesla twelve-inch spherical imaging volume, the superconductive-coil portions 18–24 together may have a total electrical impedance of generally 100 (one hundred) ohms in the normal state, and the bipolar current-bypass electrical-circuit element 16 has an electrical impedance of generally 0.010 (one-hundredth) ohm. The bipolar current-bypass electrical-circuit element 16 is coupled to the superconductive-coil assemblage 14 only through the first and second terminals 42 and 44. The first terminal 42 is only coupled to the superconductive-coil assemblage 14 in parallel with the first and second superconductive-coil portions 18 and 20, and the second terminal 44 is only coupled to the superconductive-coil assemblage 14 in parallel with the third and fourth superconductive-coil portions 22 and 24.

In a first preferred construction, shown in FIG. 3, the bipolar current-bypass electrical-circuit element 16 preferably comprises (more preferably consists essentially of, and most preferably consists of) first and second diodes 46 and 48 opposingly coupled together in parallel. Other examples of a bipolar current-bypass electrical-circuit element capable of having low impedance (i.e., an electrical impedance less than generally one-thousandth that of the four coil portions 18 to 24 of the superconductive-coil assemblage 14) include, without limitation, a resistor, a pair of SCR's (silicon controlled rectifiers) opposingly coupled together in parallel, a length of superconductive shunt, etc., as is known to those skilled in the art. With the first preferred construction, it is desired that the first and second diodes 46 and 48 are generally identical, with the first diode 46 having a forward bias voltage of at least generally five volts (and preferably of generally ten volts) at a temperature of generally ten Kelvin. It is noted that since the voltage within the superconductive-coil assemblage 14 is considered to be zero during steady-state superconductive operation, the diodes 46 and 48 can only conduct during a quench event when high resistive voltages are encountered. The forward bias voltage prevents the diodes 46 and 48 from "leaking" during normal superconductive operation of the superconducting magnet 10. However, such "leaking", which is present when, for example, a resistor is used as the bipolar current-bypass electrical-circuit element 16, is relatively small and may be tolerated in many magnet applications.

The circuit 12 desirably further (and conventionally) contains a power supply (i.e., current supply) 50 for ramping up the superconductive-coil assemblage 14 and a superconductive switch 52. The superconductive switch 52 is used to transfer between a persistent superconducting operating mode and a nonpersistent superconducting operating mode. Typically the superconductive switch 52 is used to start up superconductive operation of the superconducting magnet 10 and to purposely run down such superconductive operation.

Preferably, the circuit 12 is used as the only magnet quench protecting means. However, the circuit 12 may be combined with other quench-protecting means. For example, the circuit 12 may be combined with an energy dump resistor and/or a wide-area heater, as can be appreciated by those skilled in the art. It is noted that, in many MRI superconducting magnets, quench protection must operate in approximately two seconds after the localized magnet quench spontaneously starts. However, the potentially-damaging temperatures and stresses applied by the localized quench to the superconductive-coil assemblage 14 increase very rapidly with increasing protection system operating time so that every tenth of a second speed-up in the protection system operation provides a significant benefit in avoiding damage to the superconductive magnet coil assemblage 14. Although not shown in the figures, it is noted that a voltage clamp (e.g., a resistor whose a first lead is coupled in parallel with the second and third superconductive-coil portions and whose second lead preferably is coupled in series with a bipolar semi-conductor switch [such as third and fourth diodes coupled together in parallel]) may be added if electrical insulation is not adequate to handle the high voltages experienced by the circuit of the invention during a quench event.

The operation and advantages of the circuit 12 of the invention in protecting superconducting magnets (such as superconducting magnet 10 shown in FIGS. 1 and 2) during a quench will now be discussed. It is noted that the four superconductive-coil portions may be abutting, spaced-apart, or any combination thereof. It is further noted that a coil portion may comprise one or more abutting or spaced-apart coil subportions (not shown in the figures). Preferably, and generally speaking, for magnetic purposes superconductive-coil portions 18 and 20 are (generally) identical, and superconductive-coil portions 22 and 24 are (generally) identical. Preferably however, for quench protection purposes, superconductive-coil portions 20 and 22 are closely associated electrically, and superconductive-coil portions 18 and 24 are closely associated electrically.

It is recognized in this invention that the desired destabilizing condition after a quench develops is associated with providing a circuit topology that includes a very fast intrinsic time constant. A fast time constant can cause sufficient voltage imbalance for earlier quench detection than with traditional schemes, but, more importantly, it creates faster current imbalances that generate AC losses which are distributed throughout the superconductor volume, even to remote and magnetically uncoupled magnetic system members. Given a large coil inductance and a vanishingly small initial resistance, the time constant is too large to serve AC loss or even early voltage asymmetry. However, if the inductor (i.e., the superconductive-coil assemblage) is split in the manner (i.e., the superconductive-coil portions) of the invention as to obtain two sections with maximal mutual inductance, then the network topology circuit transient eigenvalues (which are the modal time constants) always include a very low time constant compared to full inductance divided by available resistance. The split can be achieved by winding an inner radius coil and an outer radius coil (as in the previously-described first preferred construction of the invention) and providing a small (say one percent or so) coil thicknesses compared to coil radius so that the mutual inductances are approaching the full value of either of the paired inductances. The time constant of the combined pair is the total pair inductance divided by the pair resistance. If, however, a tap at the split pair intersection allows current to the low-impedance, bipolar current-bypass electrical-circuit element of the invention, then the time constant associated with shifting current from the inner radius member of the split pair to the outer radius member is roughly equal to the difference between the typical member self inductance and the member's mutual inductance to the complementary member. Thus a current "mobility" time constant reduction by roughly two orders of magnitude can be achieved.

The split pair of the invention can also be achieved, as previously noted, in cases where the coil cross section aspect ratio is the alternate of the above (i.e., mainly long thin windings). Such disk-like coil configuration requirements can best be highly mutually coupled if split into two thin/narrower disks in close proximity axially and of equal radial thickness. Other coil-splitting configurations exist in accelerated shell-like structures, and these may be split in closely coupled mutual inductance portions.

Resuming the argument about quench detection, propagation and protection, a hundred-fold speedup is more readily detectable if the purpose is active protection. It is also simultaneously and independently providing a linear and/or quadratic enhancement on the hundred-times in terms of AC losses. AC losses typically have a hysteretic term proportional to net current and/or magnetic field change and an eddy current term proportional to the change squared. Depending on the region, either the hysteretic or eddy current term can dominate the losses. However, an enhancement by about a hundred-times in the rate of change is of extreme importance in the prompt dissipation of the AC losses.

The low-impedance, bipolar current-bypass electrical-circuit element that allows the original split pair to transfer current internally can be another similar or identical split pair. This implies that both split pairs are low impedance but only in the sense of intra split pair current transfer, not net current from a pair to the remote other. All previous protection schemes to date do try to achieve the inter (remote) coil current transfer, if any, with the benefit of low impedance. The conventional external dump (e.g., energy-dump resistor) is a low impedance device but its trigger and activation require protracted detection and possibly a scheme of current switching by a circuit breaker and thus relies on the long inter coil time constant formed by two generally symmetric total superconducting coil halves.

An additional benefit of the destabilizing network topology described in the invention is that each of the split pairs has a member whose current is reduced and one whose current is enhanced. The rapid reduction typically occurs in the initially quenching coil portion, with a rapid enhancement in the paired coil portion. The decaying current causes AC losses in the self field and current sense. It also causes flux changes in the pair and therefore AC losses there. Simultaneously, the pair current rise causes roughly similar AC losses on a differential current basis, inducing more losses in the original pair by remote flux changes. Substantially important is that the second of the pair rises in current approaching the critical regime and hence ultimate destabilization. This is achieved both by current rise, field rise and temperature rise due to AC losses. This occurs very much more rapidly compared to any conventional scheme that relies on total pair inductance relative to pair resistance ratio time constant. The approach to critical condition causes a normal transition, and, now at a higher current density and self field, the secondary of the pair propagates the quench even more rapidly than the primary of the pair. The secondary's faster decay now causes a crossing of the currents between the pairs and forces the primary to again rise, possibly far above its original current. This causes even more enhanced AC losses in both pairs and can possibly raise the primary toward critical condition throughout its volume.

This push-pull instability is precisely in the nature of a resonating, or low damping electrical circuit where the oscillations are driven from internal energy sources such as the main magnetic field and the net quench propagation and its associated voltages. As the circuit oscillates at its natural low time constant associated frequency, this is modified by the increased resistance which tends to increase the resonant frequency. However, at the same time, a more mature quench zone requires more energy dissipation for an equivalent resistance change, so there is a self limiting effect. Therefore, the associated inductive voltages are damped by the self-limiting, current-squared times resistance (ohmic) losses throughout the whole system. In effect, the time constant for a mature quench is roughly the ratio of total magnetic energy associated with the pair and its resistive rate of dissipation, with the enthalpy/heat capacity causing the self limit. Thus, the protection circuit of the invention is maximally destabilizing, approaching the self-limiting condition of the entire coil(pair) resistive dissipation.

At the same time that the primary coil pairs exhibit the resonant current swing, it forces the current differential—inner to outer pair—to destabilize the second split pair. The swing causes in turn AC losses, approach to critical, and soon thereafter normal transition. The second coil pair also has the tendency to resonate. It, having different initial quench conditions, may not be in phase with the primary coil resonant swings. The nature of the push-pull circuit in electrical terms is precisely that of both positive and negative feedback systems with switching roles, wherein lies the oscillatory drive mechanism.

Other advantages of the resonant circuit quench protection scheme of the invention are that each coil pair is modulating the current to the extent that the average amp-turns can be made to change rather slowly and symmetrically between the two coil pairs. This causes a gradual (i.e., not rapid) change of external to coil pair field, whether in inductively coupled resistive components such as in the thermal shields of the other pair. The slow Lorentz force modulation implies no rapid impulsive effects that would require additional support strengthening. The balanced internal current couple between the split members also implies a gradual far field reduction without excesses that are caused by current imbalances. This is again due to tight mutual couplings of the split pair.

As previously mentioned, the intermediate current coupling between the split pairs (i.e., the bipolar current-bypass electrical-circuit element) can be achieved by a resistive component (in case there is full symmetry about the magnet topological center—at no resistive loss penalty) or by a switching component like a back-to-back diode pair. In fact, a highly stabilized superconductor can serve as an intermediary without performance loss on the charging ramp. The resonant condition does not appear during the charging ramp as the entire coil system is superconducting, so the stabilization designs are not at all inhibited.

Other benefits accrue from the resonant circuit protection scheme. These include: faster events; lower coil voltages due to the self limiting and oscillatory properties of the network; lower maximum temperature and thermal gradients (which usually cause thermal strain due to a more rapid quench event); and higher energy packing into the coils which typically are the most massive electrical components of the system. These advantages also imply that an otherwise conservative quench protection scheme with some reduced operating stability (to allow for more destabilizing effects during quench) can be pushed to a higher level of stability. The associated advantage is that the energy associated with the inductor can be increased and the temperature, voltages, etc. penalties compensated by the resonant circuit, thus rendering a more cost effective design.

The foregoing description of several preferred embodiments of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

I claim:

1. A superconductive-magnet electrical circuit comprising:
   a) a superconductive-coil assemblage including first, second, third, and fourth superconductive-coil portions together having a total electrical impedance, wherein said second superconductive-coil portion is coupled in series with and between said first and third superconductive-coil portions, wherein said third superconductive-coil portion is coupled in series with and between said second and fourth superconductive-coil portions, wherein said first and second superconductive-coil portions abut each other and together define a generally annular-shaped first superconductive coil having a generally longitudinally-extending first axis, wherein said third and fourth superconductive-coil portions abut each other and together define a generally annular-shaped second superconductive coil having a generally longitudinally-extending second axis, wherein said second superconductive coil is longitudinally spaced apart from said first superconductive coil, and wherein said second axis is generally coaxially aligned with said first axis; and
   b) a bipolar currant-bypass electrical-circuit element having a first terminal, a second terminal, and an electrical impedance less than generally one-thousandth of said total electrical impedance, wherein said bipolar current-bypass electrical-circuit element is coupled to said superconductive-coil assemblage only through said first and second terminals, wherein said first terminal is only coupled to said superconductive-coil assemblage in parallel with said first and second superconductive-coil portions, and wherein said second terminal is only coupled to said superconductive-coil assemblage in parallel with said third and fourth superconductive-coil portions.

2. The circuit of claim 1, wherein said bipolar current-bypass electrical-circuit element consists of first and second diodes opposingly coupled together in parallel.

3. The circuit of claim 2, wherein said first and second diodes are generally identical, and wherein said first diode has a forward bias voltage of at least generally five volts at a temperature of generally ten Kelvin.

4. The circuit of claim 1, wherein said superconductive-coil assemblage is a magnetic resonance imaging superconductive-coil assemblage having an imaging volume located generally longitudinally midway between said first and second superconductive coils.

5. The circuit of claim 4, wherein said second superconductive-coil portion is disposed radially outward of and is radially superimposed on said first superconductive-coil portion, and wherein said third superconductive-coil portion is disposed radially outward of and is radially superimposed on said fourth superconductive-coil portion.

6. The circuit of claim 5, wherein said first superconductive coil is generally identical to said second superconductive coil.

7. The circuit of claim 6, wherein said first and fourth superconductive-coil portions are generally identical, and wherein said second and third superconductive-coil portions are generally identical.

8. The circuit of claim 7, wherein said bipolar current-bypass electrical-circuit element consists of first and second diodes opposingly coupled together in parallel.

9. The circuit of claim 8, wherein said first and second diodes are generally identical, and wherein said first diode has a forward bias voltage of at least generally five volts at a temperature of generally ten Kelvin.

* * * * *